(12) United States Patent
Yan et al.

(10) Patent No.: US 10,720,880 B2
(45) Date of Patent: Jul. 21, 2020

(54) PHOTOVOLTAIC INVERTER

(71) Applicant: SUNGROW POWER SUPPLY CO., LTD., Hefei, Anhui (CN)

(72) Inventors: Longxiang Yan, Anhui (CN); Rubin Wan, Anhui (CN); Xianwei Zhang, Anhui (CN); Wei Zhang, Anhui (CN); Changchun Chen, Anhui (CN)

(73) Assignee: SUNGROW POWER SUPPLY CO., LTD., Hefei, Anhui (CN)

(*) Notice: Subject to any disclaimer, the term of this patent is extended or adjusted under 35 U.S.C. 154(b) by 0 days.

(21) Appl. No.: 16/531,455

(22) Filed: Aug. 5, 2019

(65) Prior Publication Data
US 2020/0076363 A1  Mar. 5, 2020

(30) Foreign Application Priority Data
Sep. 4, 2018  (CN) .................. 2018 2 144326 U

(51) Int. Cl.
| | |
|---|---|
| H02B 1/48 | (2006.01) |
| H02S 40/34 | (2014.01) |
| H05K 7/20 | (2006.01) |
| H02S 40/32 | (2014.01) |
| H02M 7/42 | (2006.01) |
| H05K 5/00 | (2006.01) |

(52) U.S. Cl.
CPC ............. *H02S 40/345* (2014.12); *H02B 1/48* (2013.01); *H02M 7/42* (2013.01); *H02S 40/32* (2014.12); *H05K 5/0004* (2013.01); *H05K 7/20127* (2013.01)

(58) Field of Classification Search
None
See application file for complete search history.

(56) References Cited

U.S. PATENT DOCUMENTS

| | | | |
|---|---|---|---|
| 7,112,131 B2 * | 9/2006 | Rasmussen | H05K 7/20736 454/184 |
| 7,278,273 B1 * | 10/2007 | Whitted | G06F 1/16 361/690 |
| 8,233,278 B2 * | 7/2012 | Hoffman | H05K 7/20909 165/122 |

(Continued)

FOREIGN PATENT DOCUMENTS

CN   204167717 U   2/2015

OTHER PUBLICATIONS

Extended Search Report for counterpart EP Application No. 19188460.0 dated Jan. 30, 2020.

*Primary Examiner* — Courtney L Smith
(74) *Attorney, Agent, or Firm* — Cantor Colburn LLP

(57) ABSTRACT

A photovoltaic inverter includes a box, and an inverter cabinet, a direct current cabinet, an alternating current cabinet, a communication cabinet, and a power distribution cabinet which are all arranged in the box. The inverter cabinet is arranged on a first side of the box. The alternating current cabinet, the communication cabinet and the power distribution cabinet are all arranged on a second side of the box. The alternating current cabinet, the communication cabinet, and the power distribution cabinet are all arranged opposite to the inverter cabinet. The direct current cabinet is arranged on a third side of the box, and the direct current cabinet is arranged on a same side of the inverter cabinet and the alternating current cabinet.

18 Claims, 2 Drawing Sheets

(56) References Cited

U.S. PATENT DOCUMENTS

| | | | |
|---|---|---|---|
| 9,723,742 B2* | 8/2017 | Steeves | G06F 1/00 |
| 2007/0217125 A1* | 9/2007 | Johnson | H02J 9/062 |
| | | | 361/600 |
| 2010/0223858 A1* | 9/2010 | Billings | H05K 7/20745 |
| | | | 52/79.1 |
| 2012/0255710 A1* | 10/2012 | Maselli | H05K 7/1497 |
| | | | 165/80.2 |
| 2014/0247539 A1 | 9/2014 | Valencic et al. | |
| 2016/0037677 A1* | 2/2016 | Yamanaka | H05K 7/20918 |
| | | | 361/697 |
| 2018/0090913 A1* | 3/2018 | Johnson | H02B 1/565 |
| 2018/0352685 A1* | 12/2018 | Wan | H02M 7/003 |

\* cited by examiner

PHOTOVOLTAIC INVERTER

CROSS REFERENCE TO RELATED APPLICATION

The present application claims priority under 35 U.S.C. § 119 to Chinese Patent Application No. 201821444326.3, filed on Sep. 4, 2018, the entire content of which is incorporated herein by reference.

FIELD

The present disclosure relates to the technical field of photovoltaic power generation apparatus, and in particular to a photovoltaic inverter.

BACKGROUND

A photovoltaic inverter is configured to convert variable direct current generated by photovoltaic solar panels into alternating current. With the increasingly fierce competition in the photovoltaic industry, it has become an industry trend to continuously increase the power density of inverters and reduce the cost per kilowatt-hour. At present, for high-power photovoltaic inverters, in order to no longer set the inverters in traditional outdoor rooms, multiple inverters are arranged in a container to reduce the cost.

Specifically, the photovoltaic inverter includes a box, and an inverter cabinet, a direct current cabinet, a communication cabinet, a power distribution box, and the like which are arranged in the box. Generally, the direct current cabinet and the inverter cabinet are arranged on a same side of the box, and in order to increase the power, both sides of the box are provided with the inverter cabinet and the direct current cabinet, such that direct current wiring and alternating current wiring are provided on both sides of the box, which makes the wiring rather complicated.

Besides, since both sides of the box are provided with the inverter cabinet and the direct current cabinet, and direct current wiring and alternating current wiring are provided on both sides of the box, it is inconvenient to perform maintenance.

In addition, the above arrangement limits a rated power of the entire apparatus to a small one. To be specific, the rated power of the entire apparatus does not exceed 3 MW. Since both sides of the box are provided with the inverter cabinet and the direct current cabinet, a large number of cabinets are provided. The power distribution cabinet and the communication cabinet are further provided, therefore, there are more types of cabinets, resulting in higher costs.

In summary, an issue to be addressed urgently by those skilled in the art is to design a photovoltaic inverter to simplify wiring and facilitate maintenance.

SUMMARY

In view of this, a photovoltaic inverter is provided according to the disclosure to simplify wiring and facilitate maintenance.

The following technical solutions are provided according to the present disclosure.

A photovoltaic inverter includes a box, and an inverter cabinet, a direct current cabinet, an alternating current cabinet, a communication cabinet, and a power distribution cabinet which are all arranged in the box. The inverter cabinet is arranged on a first side of the box. The alternating current cabinet, the communication cabinet and the power distribution cabinet are all arranged on a second side of the box. The alternating current cabinet, the communication cabinet, and the power distribution cabinet are all arranged opposite to the inverter cabinet. The direct current cabinet is arranged on a third side of the box, and the direct current cabinet is arranged on a same side of the inverter cabinet and the alternating current cabinet.

In an embodiment, a maintenance passage is arranged between the alternating current cabinet and the inverter cabinet. The maintenance passage is also arranged between the communication cabinet and the inverter cabinet. The maintenance passage is also arranged between the power distribution cabinet and the inverter cabinet. The maintenance passage extends to the direct current cabinet. The box is provided with a maintenance entrance communicated with the maintenance passage.

In an embodiment, the maintenance entrance is arranged on the side of the box where the inverter cabinet is arranged, or the maintenance entrance is arranged on the side of the box where the alternating current cabinet is arranged. The maintenance entrance and the direct current cabinet are respectively located at two ends of the maintenance passage.

In an embodiment, the communication cabinet and the power distribution cabinet are integrated in one cabinet.

In an embodiment, the alternating current cabinet is arranged adjacent to the direct current cabinet.

In an embodiment, the box is provided with at least two installation doors, and any two of the installation doors are respectively mounted on two different side plates of the box.

In an embodiment, the box is provided with three installation doors including a first installation door, a second installation door and a third installation door. The first installation door is arranged on the side of the box where the direct current cabinet is arranged. The second installation door is arranged on the side of the box where the inverter cabinet is arranged. The third installation door is arranged on the side of the box where the alternating current cabinet, the communication cabinet and the power distribution cabinet are arranged.

In an embodiment, both the first side and the second side of the box are provided with vents for air to go in and out of the box.

In an embodiment, in the box, vents for air to go in and out of the box include an air inlet at a bottom of the box and an air outlet at a top of the box.

In an embodiment, the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet. The first heat dissipation air channel, the second heat dissipation air channel and the third heat dissipation air channel are independent of each other.

Compared with the conventional technology, in the photovoltaic inverter provided according to the present disclosure, the inverter cabinet, the direct current cabinet, the alternating current cabinet, the communication cabinet, and the power distribution cabinet are arranged on three sides of the box, the inverter cabinet is arranged opposite to the alternating current cabinet, and the direct current cabinet is arranged on a same side of the inverter cabinet and the alternating current cabinet, such that direct current wires can be connected to one side of the box and alternating current wires can be connected to another side of the box, which regulates the wiring and further simplifies the wiring. In addition, it facilitates maintaining the cabinets by arranging the inverter cabinet, the direct current cabinet, the alternating current cabinet, the communication cabinet and the power distribution cabinet on three sides of the box. Moreover, it also facilitates maintenance by connecting the direct current wires and the alternating current wires to different sides of the box.

In the photovoltaic inverter provided according to the present disclosure, the inverter cabinet is separately arranged on a side of the box, which facilitates increasing the number of inverter units, thereby increasing the rated power of the entire apparatus. Moreover, since the inverter cabinet, the direct current cabinet, and the alternating current cabinet, the communication cabinet, and the power distribution cabinet are arranged on three sides of the box, two or more inverter units can be arranged in a same cabinet, and two or more direct current units can be arranged in a same cabinet, which reduces the number of cabinets and reduces the cost.

BRIEF DESCRIPTION OF THE DRAWINGS

For more clearly illustrating the technical solutions in the embodiments of the present disclosure or in the conventional technology, drawings referred to describe the embodiments or the conventional technology will be briefly described hereinafter. The drawings in the following description show embodiments of the present disclosure, and for those skilled in the art, other drawings may be obtained based on the provided drawings without any creative efforts.

DETAILED DESCRIPTION OF THE EMBODIMENTS

The technical solutions in the embodiments of the present disclosure are described clearly and completely hereinafter in conjunction with the drawings in the embodiments of the present disclosure. The described embodiments are merely some rather than all embodiments of the present disclosure. Based on the embodiments of the present disclosure, all other embodiments obtained by those skilled in the art without creative efforts shall fall within the protection scope of the present disclosure.

Figure 1:
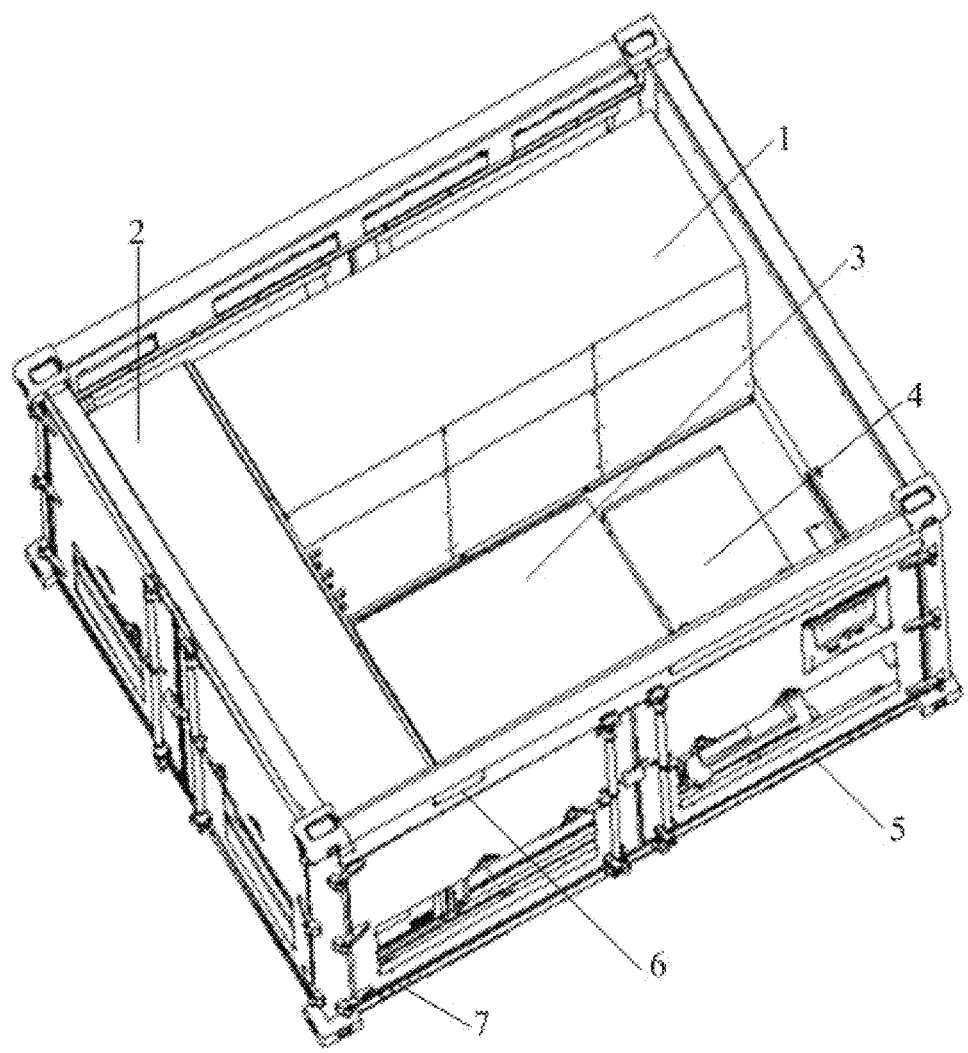
FIG. 1 is a schematic structural diagram of a photovoltaic inverter according to an embodiment of the present disclosure.
Figure 2:
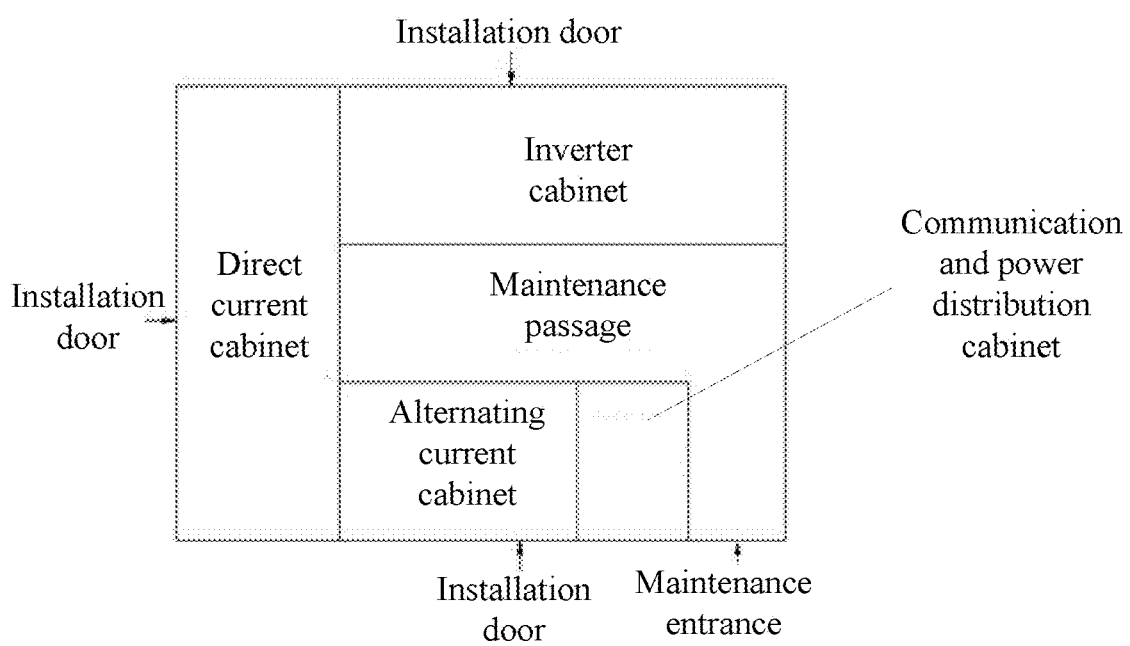
FIG. 2 is a block diagram of a photovoltaic inverter according to an embodiment of the present disclosure.

As shown in FIG. 1 and FIG. 2, the photovoltaic inverter provided by the embodiments of the present disclosure includes: a box 5; and an inverter cabinet 1, a direct current cabinet 2, an alternating current cabinet 3, a communication cabinet, and a power distribution cabinet which are all arranged in the box 5.

The inverter cabinet 1 is arranged on a first side of the box 5. The alternating current cabinet 3, the communication cabinet and the power distribution cabinet are all arranged on a second side of the box 5. The alternating current cabinet 3, the communication cabinet, and the power distribution cabinet are all arranged opposite to the inverter cabinet 1. The direct current cabinet 2 is arranged on a third side of the box 5, and the direct current cabinet 2 is arranged on a same side of the inverter cabinet 1 and the alternating current cabinet 3. In order to make full use of the space, the direct current cabinet 2 extends from the first side of the box 5 to the second side of the box 5. Preferably, the above box 5 is a container.

It can be understood that the first side of the box 5 is opposite to the second side of the box 5, and the third side of the box 5 is located at a same end of the first side and the second side of the box 5. Preferably, the box 5 has a cuboid shape or cube shape. The inverter cabinet 1, the direct current cabinet 2, the alternating current cabinet 3, the communication cabinet, and the power distribution cabinet are connected by electrical components to realize the invert function of the entire apparatus.

Compared with the conventional technology, in the photovoltaic inverter provided by the embodiments of the present disclosure, the inverter cabinet 1, the direct current cabinet 2, the alternating current cabinet 3, the communication cabinet, and the power distribution cabinet are arranged on three sides of the box 5, the inverter cabinet 1 is arranged opposite to the alternating current cabinet 3, and the direct current cabinet 2 is arranged on a same side of the inverter cabinet 1 and the alternating current cabinet 3, such that direct current wires can be connected to one side of the box 5 and alternating current wires can be connected to another side of the box 5, which regulates the wiring, further simplifies the wiring, and facilitates the field construction of power stations. In addition, it facilitates maintaining the cabinets by arranging the inverter cabinet 1, the direct current cabinet 2, the alternating current cabinet 3, the communication cabinet and the power distribution cabinet on three sides of the box 5. Moreover, it also facilitates maintenance by connecting the direct current wires and the alternating current wires to different sides of the box 5.

In the photovoltaic inverter provided by the embodiments of the present disclosure, the inverter cabinet 1 is separately arranged on a side of the box 5, which facilitates increasing the number of inverter units, thereby increasing the rated power of the entire apparatus and reducing the cost per kilowatt-hour. Moreover, since the inverter cabinet 1, the direct current cabinet 2, and the alternating current cabinet 3, the communication cabinet, and the power distribution cabinet are arranged on three sides of the box 5, two or more inverter units can be arranged in a same cabinet, and two or more direct current units can be arranged in a same cabinet, which reduces the number of cabinets and reduces the cost.

Experiments show that the power of the above photovoltaic inverter is more than 3 MW.

If the above photovoltaic inverter is used, direct current input wires may be connected to a lower side of the direct current cabinet 2, and alternating current output wires may be connected to a lower side of the alternating current cabinet 3 or to a side of the box 5, when wiring is performed in the power station. Since the alternating current output wires can be connected to a lower side of the alternating current cabinet 3 or to a side of the box 5, the requirements for two different types of wiring can be met, and the performance of the photovoltaic inverter is improved.

In order to facilitate after-sales maintenance, a maintenance passage is arranged between the alternating current cabinet 3 and the inverter cabinet 1, between the communication cabinet and the inverter cabinet 1, and between the power distribution cabinet and the inverter cabinet 1, and the maintenance passage extends to the direct current cabinet 2. The box 5 is provided with a maintenance entrance communicated with the maintenance passage. With such arrangement, maintenance can be performed along the maintenance passage for the inverter cabinet arranged on one side of the maintenance passage, the alternating current cabinet 3, the communication cabinet and the power distribution cabinet arranged on the other side of the maintenance passage, and the direct current cabinet 2 arranged on one end of the maintenance passage.

In the above photovoltaic inverter, the above maintenance passage may be arranged at other positions, and which is not limited to the above embodiment.

In the above photovoltaic inverter, position of the maintenance entrance may be selected according to actual needs. Specifically, the maintenance entrance is arranged on the side of the box 5 where the inverter cabinet 1 is arranged, or the maintenance entrance is arranged on the side of the box 5 where the alternating current cabinet 3 is arranged.

Preferably, the maintenance entrance and the direct current cabinet 2 are respectively located at two ends of the maintenance passage. Apparently, the maintenance entrance may be arranged in the middle of the maintenance passage, and which is not limited thereto.

In order to reduce the number of cabinets, the communication cabinet and the power distribution cabinet may be integrated in a same cabinet. Specifically, the communication cabinet and the power distribution cabinet are integrated in the same cabinet, to form a communication and power distribution cabinet 4, as shown in FIG. 1.

In the above photovoltaic inverter, the number of types of cabinets is reduces and the cost is reduced.

In the photovoltaic inverter, the inverter cabinet 1 is connected to the direct current cabinet 2, and the direct current cabinet 2 is connected to the alternating current cabinet 3. In order to facilitate the connection, the alternating current cabinet 3 is arranged adjacent to the direct current cabinet 2. For example, in a case that the communication cabinet and the power distribution cabinet are integrated in the same cabinet to form the communication and power distribution cabinet 4, the communication cabinet 3 is arranged between the direct current cabinet 2 and the communication and power distribution cabinet 4.

In order to facilitate installation and maintenance, the box 5 is provided with at least two installation doors, and any two of the installation doors are respectively arranged on two different side plates of the box 5.

In an embodiment, in a case that the box 5 is provided with a maintenance entrance in communication with the maintenance passage, the maintenance entrance and one of the installation doors are arranged on a same side plate of the box 5.

In an embodiment, the box 5 is provided with three installation doors including a first installation door, a second installation door and a third installation door. The first installation door is arranged on the side of the box 5 where the direct current cabinet 2 is arranged. The second installation door is arranged on the side of the box 5 where the inverter cabinet 1 is arranged. The third installation door is arranged on the side of the box 5 where the alternating current cabinet 3, the communication cabinet and the power distribution cabinet are arranged.

In the above structure, front of the cabinets can be maintained. Since the box 5 is provided with the maintenance passage and the maintenance entrance, back of the cabinets can be maintained by entering the box 5.

Apparently, the number of the installation doors may be another number, and the installation doors may be arranged in other manners, and which are not limited to the above embodiment.

In order to facilitate heat dissipation of components in the box 5, both the first side and the second side of the box 5 are provided with vents for air to go in and out of the box 5.

In an embodiment, in the box 5, the vents for air to go in and out of the box 5 include an air inlet 7 at a bottom of the box 5 and an air outlet 6 at a top of the box 5. The above structure is arranged in a manner that the air enters the box at the bottom of the box and exits from the box at the top of the box, which facilitates flow of the air, thereby improving the heat dissipation efficiency.

Apparently, the air outlet 6 and the air inlet 7 may be arranged in other manners, which are not limited thereto.

In order to reduce the influence among the cabinets, the box 5 is provided with a first heat dissipation air channel, a second heat dissipation air channel and a third heat dissipation air channel. The first heat dissipation air channel is used for dissipating heat of the direct current cabinet 2. The second heat dissipation air channel is used for dissipating heat of the invert cabinet 1. The third heat dissipation air channel is used for dissipating heat of the alternating current cabinet 3, the communication cabinet, and the power distribution cabinet. The first heat dissipation air channel, the second heat dissipation air channel, and the third heat dissipation air channel are independent of each other.

In the above structure, the first heat dissipation air channel only dissipates heat of the direct current cabinet 2, and the second heat dissipation air channel only dissipates heat of the inverter cabinet 1, and the third heat dissipation air channel only dissipates heat of the alternating current cabinet 3, the communication cabinet, and the power distribution cabinet, thereby preventing the direct current cabinet 2, the inverter cabinet 1 and the alternating current cabinet 3, the communication cabinet and the power distribution cabinet from affecting each other, and improving heat dissipation effects.

It should be noted that inlets of the first heat dissipation air channel, the second heat dissipation air channel and the third heat dissipation air channel are all connected with the air inlet 7, and outlets of the first heat dissipation air channel, the second heat dissipation air channel and the third heat dissipation air channel are all connected with the air outlet 6.

It should be noted that the relationship terminologies such as first and second are only used herein to distinguish an entity or operation from another entity or operation, and it is not necessarily required or implied that there are any actual relationship or order between those entities and operations.

Based on the above description of the disclosed embodiments, those skilled in the art can implement or deploy the present disclosure. It is obvious for those skilled in the art to make many modifications to these embodiments. The general principle defined herein may be applied to other embodiments without departing from the spirit or scope of the present disclosure. Therefore, the present disclosure is not limited to these embodiments illustrated herein, but should be defined by the broadest scope consistent with the principle and novel features disclosed herein.

The invention claimed is:
1. A photovoltaic inverter, comprising:
a box; and
an inverter cabinet, a direct current cabinet, an alternating current cabinet, a communication cabinet, and a power distribution cabinet which are all arranged in the box, wherein
the inverter cabinet is arranged on a first side of the box;
the alternating current cabinet, the communication cabinet and the power distribution cabinet are all arranged on a second side of the box, and the alternating current cabinet, the communication cabinet, and the power distribution cabinet are all arranged opposite to the inverter cabinet; and the direct current cabinet is arranged on a third side of the box, and the direct current cabinet is arranged on a same side of the inverter cabinet and the alternating current cabinet.

2. The photovoltaic inverter according to claim 1, wherein a maintenance passage is arranged between the alternating current cabinet and the inverter cabinet, the maintenance passage is also arranged between the communication cabinet and the inverter cabinet, and the maintenance passage is also arranged between the power distribution cabinet and the inverter cabinet, and the maintenance passage extends to the direct current cabinet; and the box is provided with a maintenance entrance communicated with the maintenance passage.

3. The photovoltaic inverter according to claim 2, wherein
the maintenance entrance is arranged on the side of the box where the inverter cabinet is arranged, or the maintenance entrance is arranged on the side of the box where the alternating current cabinet is arranged; and
the maintenance entrance and the direct current cabinet are respectively located at two ends of the maintenance passage.

4. The photovoltaic inverter according to claim 1, wherein the communication cabinet and the power distribution cabinet are integrated in one cabinet.

5. The photovoltaic inverter according to claim 1, wherein the alternating current cabinet is arranged adjacent to the direct current cabinet.

6. The photovoltaic inverter according to claim 1, wherein the box is provided with at least two installation doors, and any two of the installation doors are respectively mounted on two different side plates of the box.

7. The photovoltaic inverter according to claim 6, wherein the box is provided with three installation doors comprising a first installation door, a second installation door and a third installation door, the first installation door is arranged on the side of the box where the direct current cabinet is arranged, the second installation door is arranged on the side of the box where the inverter cabinet is arranged, the third installation door is arranged on the side of the box where the alternating current cabinet, the communication cabinet and the power distribution cabinet are arranged.

8. The photovoltaic inverter according to claim 1, wherein both the first side and the second side of the box are provided with vents for air to go in and out of the box.

9. The photovoltaic inverter according to claim 1, wherein in the box, vents for air to go in and out of the box comprise an air inlet at a bottom of the box and an air outlet at a top of the box.

10. The photovoltaic inverter according to claim 1, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

11. The photovoltaic inverter according to claim 2, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

12. The photovoltaic inverter according to claim 3, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

13. The photovoltaic inverter according to claim 4, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

14. The photovoltaic inverter according to claim 5, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

15. The photovoltaic inverter according to claim 6, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

16. The photovoltaic inverter according to claim 7, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

17. The photovoltaic inverter according to claim 8, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

18. The photovoltaic inverter according to claim 9, wherein the box is provided with a first heat dissipation air channel for dissipating heat of the direct current cabinet, a second heat dissipation air channel for dissipating heat of the invert cabinet, and a third heat dissipation air channel for dissipating heat of the alternating current cabinet, the communication cabinet, and the power distribution cabinet; and, the first heat dissipation air channel, the second heat dissipation air channel and the third heat dissipation air channel are independent of each other.

* * * * *